United States Patent
Yoshimi et al.

(10) Patent No.: US 9,917,010 B2
(45) Date of Patent: Mar. 13, 2018

(54) SEMICONDUCTOR DEVICE MANUFACTURING METHOD

(71) Applicant: Semiconductor Components Industries, LLC, Phoenix, AZ (US)

(72) Inventors: Hideaki Yoshimi, Gunma (JP); Mitsuo Umemoto, Gyeonggi-Do (KR); Kazumi Onda, Saitama (JP); Kazumi Horinaka, Saitama (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/248,020

(22) Filed: Apr. 8, 2014

(65) Prior Publication Data
US 2014/0220739 A1    Aug. 7, 2014

Related U.S. Application Data

(62) Division of application No. 11/692,596, filed on Mar. 28, 2007, now Pat. No. 8,736,047.

(30) Foreign Application Priority Data

Mar. 29, 2006 (JP) ................................. 2006-091170

(51) Int. Cl.
*H01L 21/78* (2006.01)
*H01L 23/367* (2006.01)

(52) U.S. Cl.
CPC ............ *H01L 21/78* (2013.01); *H01L 23/367* (2013.01); *H01L 2224/16* (2013.01);
(Continued)

(58) Field of Classification Search
CPC . H01L 2924/01079; H01L 2924/15311; H01L 2224/16; H01L 21/4828; H01L 23/3121; H01L 23/3735
(Continued)

(56) References Cited

U.S. PATENT DOCUMENTS 5,698,897 A * 12/1997 Nashimoto ......... H01L 23/3735
257/712
5,990,546 A * 11/1999 Igarashi .............. H01L 23/3121
257/700
(Continued)

FOREIGN PATENT DOCUMENTS

CN 1449030 A 10/2003
JP 4-291948 10/1992
(Continued)

*Primary Examiner* — Bo Fan
(74) *Attorney, Agent, or Firm* — Robert F. Hightower

(57) ABSTRACT

A semiconductor device includes: a semiconductor substrate; a heat sink mounted on an upper surface of the semiconductor substrate; wirings formed on a lower surface of the semiconductor substrate; and the like. The heat sink is mounted on the upper surface of the semiconductor substrate, and a planar size thereof is approximately the same as that of the semiconductor substrate. Moreover, the heat sink has a thickness of 500 μm to 2 mm, and may be formed to be thicker than the semiconductor substrate. By using the heat sink to reinforce the substrate, a thickness of the semiconductor substrate can be reduced to, for example, about 50 μm. As a result, a thickness of the entire semiconductor device can be reduced.

9 Claims, 6 Drawing Sheets

(52) U.S. Cl.
CPC .............. *H01L 2224/73253* (2013.01); *H01L 2924/01019* (2013.01); *H01L 2924/1305* (2013.01); *H01L 2924/13091* (2013.01)

(58) Field of Classification Search
USPC ........ 257/E23.101, 704, 706, 707, 712, 713, 257/717, 723, 787; 438/107, 109, 110, 438/111, 113, 122, 125, 200, 105
See application file for complete search history.

(56) References Cited

U.S. PATENT DOCUMENTS

| | | | |
|---|---|---|---|
| 6,069,023 | A | 5/2000 | Bernier et al. |
| 6,114,761 | A | 9/2000 | Mertol et al. |
| 6,162,659 | A | 12/2000 | Wu |
| 6,784,022 | B2 | 8/2004 | Umehara et al. |
| 6,909,178 | B2 * | 6/2005 | Sakamoto .......... H01L 21/4828 257/680 |
| 6,919,504 | B2 | 7/2005 | McCutcheon et al. |
| 7,061,100 | B2 | 6/2006 | Iwaki et al. |
| 7,112,883 | B2 | 9/2006 | Hasunuma |
| 7,186,921 | B2 | 3/2007 | Igarashi et al. |
| 2003/0189830 | A1 * | 10/2003 | Sugimoto .......... H01L 25/0753 362/294 |
| 2004/0014317 | A1 * | 1/2004 | Sakamoto ............ H01L 21/568 438/689 |
| 2005/0258536 | A1 * | 11/2005 | Lin et al. ................. 257/717 |
| 2006/0037441 | A1 | 2/2006 | Tokuhira et al. |
| 2007/0109749 | A1 | 5/2007 | Kwon et al. |
| 2008/0233388 | A1 * | 9/2008 | Morita ................ C23C 14/06 428/336 |
| 2008/0242003 | A1 * | 10/2008 | How et al. .............. 438/122 |
| 2009/0108437 | A1 * | 4/2009 | Raymond ................ 257/713 |
| 2009/0227070 | A1 * | 9/2009 | Miyajima ................ 438/113 |
| 2013/0003303 | A1 * | 1/2013 | Lindgren et al. ........ 361/704 |
| 2013/0319848 | A1 * | 12/2013 | Neidhardt .......... C23C 14/3414 204/192.12 |
| 2016/0064665 | A1 * | 3/2016 | Fumagalli .......... H01L 45/1253 257/4 |

FOREIGN PATENT DOCUMENTS

| | | |
|---|---|---|
| JP | 09-148380 | 6/1997 |
| JP | 10-279845 | 10/1998 |
| JP | 2000-77576 | 3/2000 |
| JP | 2001-118953 | 4/2001 |
| JP | 2001-144121 | 5/2001 |
| JP | 2002-033343 | 1/2002 |
| JP | 2002-33425 | 1/2002 |
| JP | 2003-26777 | 1/2003 |
| JP | 2003-031725 | 1/2003 |
| JP | 2004-172542 | 6/2004 |
| JP | 2005-340655 | 12/2005 |
| JP | 2006-352076 | 12/2006 |

* cited by examiner

SEMICONDUCTOR DEVICE MANUFACTURING METHOD

Priority is claimed to Japanese Patent Application Number JP2006-091170 filed on Mar. 29, 2006, the disclosures of which are incorporated herein by reference in its entirety.

The present application is a divisional application of prior U.S. application Ser. No. 11/692,596, filed on Mar. 28, 2007, which is hereby incorporated herein by reference, and priority thereto for common subject matter is hereby claimed.

BACKGROUND OF THE INVENTION

1. Field of the Invention

The present invention relates to a semiconductor device and a manufacturing method thereof, and particularly relates to a semiconductor device having improved heat radiation properties and a manufacturing method thereof.

2. Description of the Prior Art

As to circuit devices set in electronic equipment, reduction in size, thickness and weight thereof has heretofore been demanded for adoption thereof in portable telephones, portable computers and the like. In order to satisfy these conditions, a semiconductor device called a CSP (Chip Scale Package) has been developed, which has the same size as that of a semiconductor element to be built thereinto.

Among the CSPs, there is a particularly small WLP (Wafer Level Package). With reference to FIGS. 6A to 6C, a method for manufacturing the WLP will be schematically described. This technology is described for instance in Japanese Patent Application Publication No. 2004-172542.

With reference to FIG. 6A, first, a number of semiconductor device parts 102 are formed on a semiconductor wafer 100. In each of the semiconductor device parts 102, as transistor and the like are formed by a diffusion step. Moreover, on an upper surface of each of the semiconductor device parts 102, electrodes 101 are formed, which are connected to elements inside a substrate. Furthermore, an insulating layer 101 is formed in a state where upper parts of the electrodes 103 are exposed. On an upper surface of the insulating layer 101, wirings 104 are patterned. Furthermore, the upper surface of the insulating layer 101 is covered with a covering layer 110 so as to cover the wirings 104. Moreover, openings are provided in the covering layer 110 in regions where external electrodes 105 are to be formed. Furthermore, the external electrodes 105 made of, for example, solder or the like are welded to upper surfaces of the wirings 104. A rear surface of the semiconductor wafer 100 having such a configuration is attached to an upper surface of a dicing sheet 106.

With reference to FIG. 6B, next, the semiconductor device parts 102 are separated from each other by using a rapidly rotating blade 107 to cut the wafer 100. The semiconductor wafer 100 and the insulating layer 101 are completely cut by the blade 107. The separated semiconductor device parts 102 become semiconductor devices, respectively.

FIG. 6C shows a cross-section of a semiconductor device 108 manufactured by the above steps. It is clear from FIG. 6C that a planar size of the semiconductor device 108 is approximately the same as that of a semiconductor substrate 109. The planar size of the semiconductor device 108 is, for example, about 5 mm×5 mm, which is very small.

However, in recent semiconductor devices, an operating frequency is increased for high-speed signal processing, and a heat release value is increased. Meanwhile, in the semiconductor device described above, since the size of the entire device is small, a surface area thereof is too small to obtain sufficient heat radiation properties. Accordingly, problems such as characteristic deterioration and destruction have occurred due to a rapid increase in a temperature of the semiconductor device along with operations thereof.

As a method for solving the above problems, there is a method far releasing heat from the semiconductor device through conductive patterns formed to be partially wide on a mounting substrate side on which the semiconductor device is mounted. However, by use of the above method, the conductive patterns on the mounting substrate side are formed to be wide. Then, an area of the mounting substrate, which is practically required for mounting the semiconductor device, is increased. As a result, there is a problem that packaging density is lowered.

Furthermore, in the manufacturing method described above, chipping occurs in the dicing step using the blade. As a result, there is a problem that a crack is generated in the semiconductor substrate 109 of each of the semiconductor device parts 102. If this crack is large, characteristics of the semiconductor device are deteriorated to cause failures. Moreover, even if the crack is small, there is caused no performance failure. However, in the case where the semiconductor device 108 is the WLP, sides of the semiconductor substrate 109 are exposed to result in poor appearance.

SUMMARY OF THE INVENTION

The present invention has been made in consideration for the foregoing problems. It is a main object of the present invention to provide a semiconductor device having improved heat radiation properties and a manufacturing method thereof.

A semiconductor device of the present invention is including a semiconductor substrate having a first principal surface, on which electrodes electrically connected to circuit elements are formed, and a second principal surface facing the first principal surface; and a radiator which is mounted on the second principal surface, and which as the same planar size as that of the semiconductor substrate.

A method for manufacturing a semiconductor device of the present invention is including the steps of: preparing a semiconductor wafer which has a first principal surface, on which electrodes electrically connected to circuit elements are formed, and a second principal surface facing the first principal surface, and which has a plurality of semiconductor device parts formed thereon, which are defined by dicing lines; attaching the semiconductor wafer to a dicing sheet with a radiator plate interposed therebetween, and separating the semiconductor device parts form each other by dicing the semiconductor wafer and the radiator plate.

Furthermore, a method for manufacturing a semiconductor device of the present invention is including the steps of preparing a semiconductor wafer which has a first principal surface, on which electrodes electrically connected to circuit elements are formed, and a second principal surface facing the first principal surface, and which has a plurality of semiconductor device parts formed thereon, preparing a dicing sheet which has first and second sheets stacked with a first adhesion layer interposed therebetween, and which has an uneven adhesion surface between the sheets, attaching the semiconductor wafer to a surface of the first sheet of the dicing sheet with a second adhesion layer interposed therebetween, individually separating the semiconductor device parts by performing dicing so as to cut at least the semiconductor wafer and the first sheet, and separating the first sheet bonded to the semiconductor device part from the second sheet.

DESCRIPTION OF THE PREFERRED EMBODIMENTS

With reference to the drawings, preferred embodiments of the present invention will be described in detail below.

First Embodiment

Figure 1A:
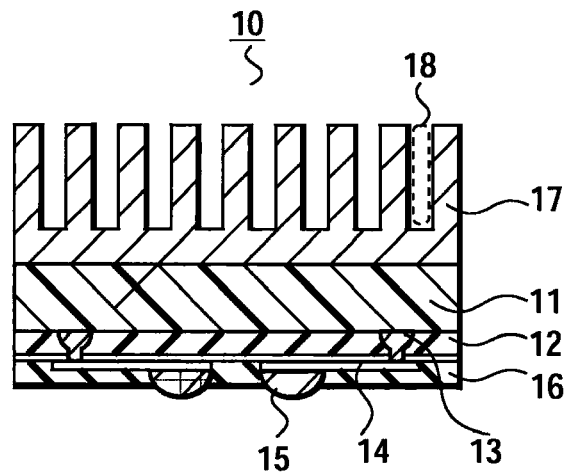
FIG. 1A is a cross-sectional view and FIG. 1B is a perspective view, showing a semiconductor device of preferred embodiments of the present invention.

First, with reference to FIGS. 1A and 1B, a configuration of a semiconductor device 10 of this embodiment will be described. FIG. 1A is a cross-sectional view of the semiconductor device 10, and FIG. 1B is a perspective view thereof.

Figure 1B:
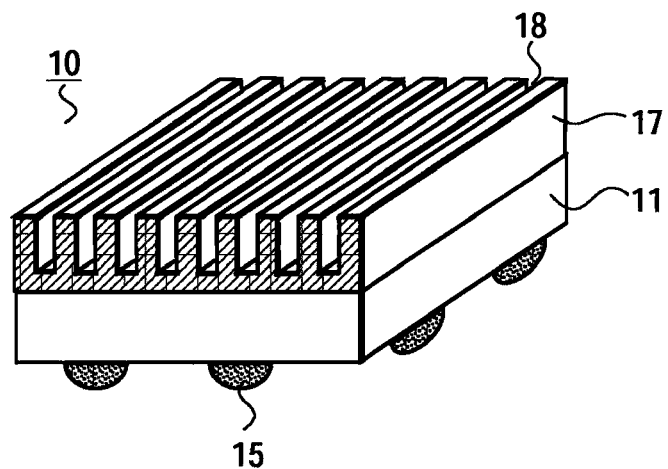

With reference to FIGS. 1A and 1B, the semiconductor device 10 includes: a semiconductor substrate 11; a heat sink 17 (radiator) mounted on an upper surface (a second principal surface) of the semiconductor substrate 11; wirings 14 formed on a lower surface (a first principal surface) of the semiconductor substrate 11; and the like.

The semiconductor substrate 11 is made of, for example, a semiconductor material such as silicon, and circuit elements are formed therein by a diffusion step. For example, a bipolar transistor, a MOSFET, a diode, a memory and the like are formed in the semiconductor substrate 11. A thickness of the semiconductor substrate 11 is, for example, about 25 μn to 500 μm (for example, about 50 μm). In this embodiment, the semiconductor substrate 11 is reinforced by mounting thereon the heat sink 17 made of, for example, a metal such as copper. Thus, the thickness of the semiconductor substrate 11 can be set as small as about 50 μm. A planar size of the semiconductor substrate 11 is, for example, about 0.5 mm×0.5 mm 10 mm×10 mm.

The heat sink 17 is mounted on the upper surface of the semiconductor substrate 11, and a planar size thereof is approximately the same as that of the semiconductor substrate 11. Moreover, the heat sink 17 has a thickness of 500 μm to 2 mm, and may be formed to be thicker than the semiconductor substrate 11. The heat sink 17 is fixed to the upper surface of the semiconductor substrate 11 by use of an insulating adhesive or the like. Note that the heat sink 17 having grooves 18 formed therein can be fabricated by extruding a metal such as copper.

Furthermore, a preferable material of the heat sink 17 is as material having a thermal conductivity higher than that of the semiconductor substrate 11. For example, a metal such as copper and aluminum is suitable as the material of the heat sink 17. Here, a thermal conductivity of silicon that is the material of the semiconductor substrate 11 is 168 [W/m/K], a thermal conductivity of copper is 390 [W/m/K], and a thermal conductivity of aluminum is 236 [W/m/K]. As described above, by adopting the material having a high thermal conductivity as the heat sink 17, heat radiation properties of the semiconductor substrate 11 can be improved.

Still furthermore, as the material of the heat sink 17, resin can also be adopted. Generally, resin is inferior to metal in the thermal conductivity. However, by adopting the heat sink 17 made of resin, a surface area of the entire semiconductor device 10 is increased. Thus, the heat radiation properties thereof are improved. Furthermore, by using resin filled with fillers made of alumina or the like to form the heat sink 17, the heat radiation properties can be further improved. Moreover, as the heat sink 17, a dicing sheet used in the steps of manufacturing a semiconductor device can also be adopted. This will be described in detail later.

With reference to FIG. 1B, in the heat sink 17, the grooves 18 are formed from a surface (upper surface) thereof which does not come into contact with the semiconductor substrate 11. A width of each of the grooves 18 is about 20 μm to 100 μm, and a depth thereof is within a range that the groove 18 does not penetrate the heat sink 17 (for example, 400 μm or more and less than 2 mm). Furthermore, the grooves 18 are extended parallel with sides of the semiconductor substrate 11, and are formed linearly and continuously from a front end of the semiconductor substrate 11 to a rear end thereof. Here, the grooves 18 may be provided in a lattice pattern. In this case, a surface area of the heat sink 17 is further increased, and a heat radiation effect can be improved.

On the lower surface of the semiconductor substrate 11, electrodes 13 electrically connected to internal elements (active regions) are formed. The lower surface of the semiconductor substrate 11, except for portions in which the electrodes 13 are formed, is covered with an insulating layer 12. The insulating layer 12 is made of, for example, a nitride film or a resin film. Furthermore, lower surfaces of the electrodes 13 are exposed to a lower side from the insulating layer 12.

On a lower surface of the insulating layer 12, the wirings 14 are formed, which come into contact with the electrodes 13. Here, the electrodes 13 are provided in a peripheral portion of the semiconductor device 10, and the wirings 14 are extended toward the inside from the peripheral portion. A portion of each of the wirings 14 is formed into a pad shape, and an external electrode 15 is welded to the pad-shaped portion. The external electrodes 15 are made of a conductive adhesive such as solder. By providing the wirings 14 as described above, the electrodes 13 arranged close to each other can be rearranged as the external electrodes 15 which are to be away from each other. Furthermore, the wirings 14, except for regions where the external electrodes 15 are formed, are covered with a covering layer 16 made of an insulating material such as resin.

Note that, when thermal expansion coefficients of the semiconductor substrate 11 and the heat sink 17 are significantly different from each other, warpage is likely to occur in the semiconductor substrate 11. For this reason, the materials, thicknesses, and the like of the insulating layer 12, the covering layer 16 and the wirings 14 are determined so as to set the upper and lower surfaces of the semiconductor substrate 11 to have the same thermal expansion coefficient. For example, when the heat sink 17 is formed to have a thickness of about 30 µm, each of the wirings 14 is also formed to have a thickness of about 30 µm. Moreover, a density of the grooves 18 may be controlled according to patterning of the wirings 14. Furthermore, when the heat sink 17 is formed to have a thickness of about 30 µm, and when each of the wirings 14 is formed to have a thickness of about 15 µm, the grooves 18 may be formed so as to increase the density thereof. Specifically, the grooves 18 are formed so as to set a volume of the wiring 14 and a volume of the heat sink 17 to be the same.

Second Embodiment

In this embodiment, with reference to FIGS. 2 to 4, description will be given of a method for manufacturing the semiconductor device having the configuration described in the first embodiment.

Figure 2A:
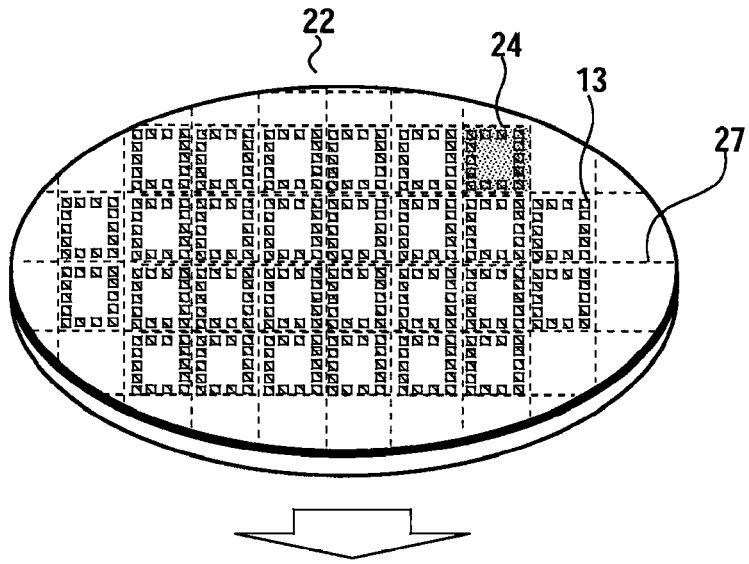
FIGS. 2A and 2B are perspective views and FIG. 2C is a cross-sectional view, showing a method for manufacturing a semiconductor device of the preferred embodiments of the present invention.

With reference to FIG. 2A, a semiconductor wafer 22 includes an upper surface (a first principal surface), on which electrodes 13 and the like are formed, and a flat lower surface (a second principal surface). Furthermore, on the semiconductor wafer 22, a number of (for example, a few hundred of) semiconductor device parts 24 are formed in a matrix pattern. The semiconductor device parts 24 are defined by dicing lines 27 which are provided in a lattice pattern. Here, each of the semiconductor device parts 24 is a part to become one semiconductor device. In each of the semiconductor device parts 24, predetermined circuit elements (active regions) are formed inside the semiconductor wafer 22, and the electrodes 13 connected to the elements are arranged in a peripheral portion of the semiconductor device parts 24. The semiconductor wafer 22 made of a semiconductor material such as silicon has a thickness of for example, about 50 µm to 500 µm.

Figure 2B:
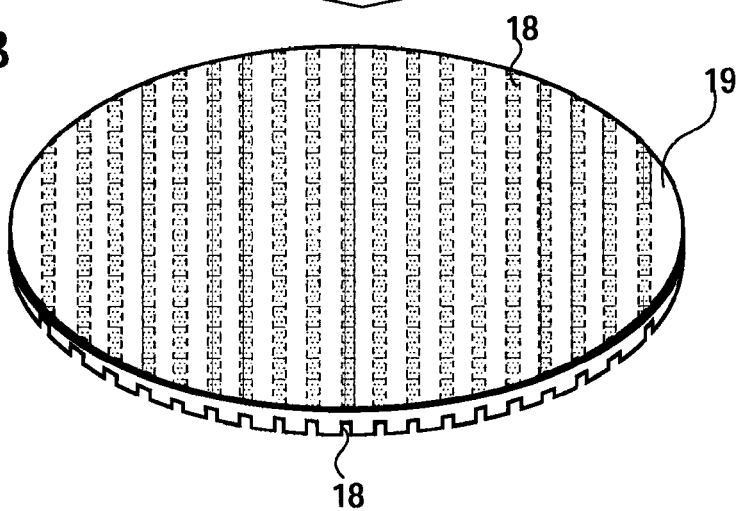

With reference to FIG. 2B, a radiator plate 19 is made of a metal such as copper and aluminum having a thickness of about 500 µm to 2 mm, and a planar size thereof is the same as that of the semiconductor wafer 22. An upper surface (a first principal surface) of the radiator plate 19 is a flat and smooth surface which comes into contact with the lower surface of the semiconductor wafer 22, and grooves 18 are formed in a lower surface (a second principal surface) thereof. A direction in which the grooves 18 are extended is preferably in parallel with the dicing lines 27 described above. Accordingly, the direction in which the grooves 18 are extended can be set parallel with sides of the semiconductor device part 24. Thus, external appearance of the device can be improved. Furthermore, by superposing the grooves 18 and the dicing lines 27, the radiator plate 19 can be cut only by removing thick portions of the radiator plate 19, in which the grooves 18 are not formed, in a dicing step.

The semiconductor wafer 22 and the radiator plate 19 are bonded to each other by use of an adhesive such as insulating resin. Specifically, after the adhesive is applied to the upper surface of the radiator plate 19 or the lower surface of the semiconductor water 22, the wafer and the plate are attached and bonded to each other.

Figure 2C:
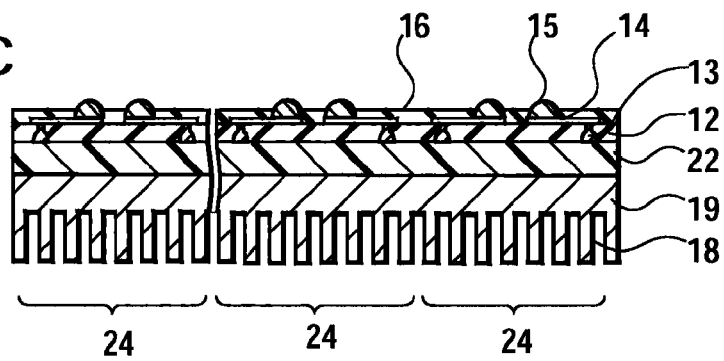

With reference to FIG. 2C, in each of the semiconductor device parts 24, the electrodes 13 connected to the elements formed inside the semiconductor wafer 22 are formed in the peripheral portion thereof. The upper surface of the semiconductor wafer 22 is covered with an insulating layer 12 made of resin or the like, in a state where the electrodes 13 are exposed. Moreover, on an upper surface of the insulating layer 12, wirings 14 are formed, which are extended toward a center portion of each semiconductor device part 24 from the peripheral portion thereof. Furthermore, a external electrode 15 made of solder or the like is welded to an upper surface of each of the wirings 14, which is formed into a pad shape. Moreover, the upper surface of the insulating layer 12, except for portions in which the external electrodes 15 are formed, is entirely covered with a covering layer 16. The wirings 14 are covered with the covering layer 16.

Note that, when thermal expansion coefficients of a semiconductor substrate 11 and the radiator plate 19 are significantly different from each other, warpage is likely to occur in the semiconductor substrate 11. For this reason, materials, thicknesses, and the like of the insulating layer 12, the covering layer 16 and the wirings 14 are determined so as to set the upper and lower surfaces of the semiconductor substrate 11 to have the same thermal expansion coefficient. For example, when the radiator plate 19 is formed to have a thickness of about 30 µm, each of the wirings 14 is also formed to have a thickness of about 30 µm. Moreover, a density of the grooves 18 may be controlled according to the patterning of the wirings 14. Furthermore, when the radiator plate 19 is formed to have a thickness of about 30 µm, and when each of the wirings 14 is formed to have a thickness of about 15 µm, the grooves 18 may be formed so as to increase the density thereof. Specifically, the grooves 18 are formed so as to set a volume of the wiring 14 and a volume of the radiator plate 19 to be the same.

Figure 3A:
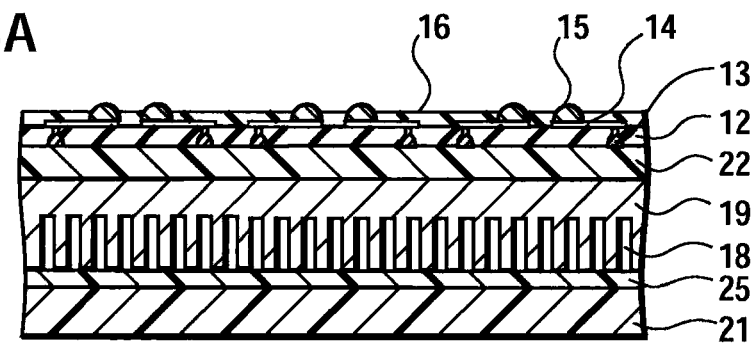
FIG. 3A is a cross-sectional view.
Figure 3B:
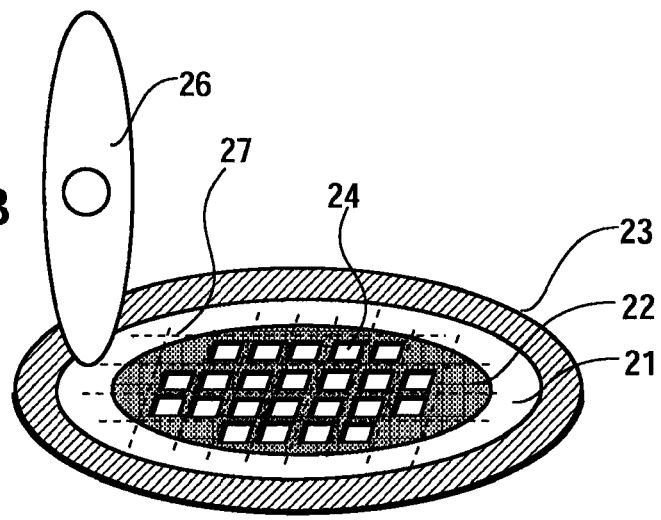
FIG. 3B is a perspective view and FIG. 3C is a cross-sectional view, showing the method for manufacturing a semiconductor device of the preferred embodiments of the present invention.
Figure 3C:
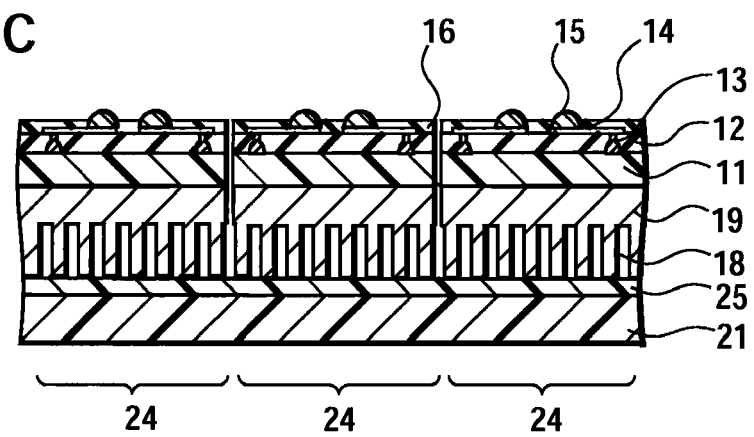

With reference to FIGS. 3A to 3C, next, the radiator plate 19 and the semiconductor wafer 22 are diced after being attached to a dicing sheet 21. FIG. 3A is a cross-sectional view showing this step, FIG. 3B is a perspective view thereof, and FIG. 3C is a cross-sectional view after the dicing is performed.

With reference to FIG. 3A, the upper surface of the radiator plate 19 is attached to the semiconductor wafer 22, and the lower surface of the radiator plate 19 is attached to the dicing sheet 21. The dicing sheet 21 is made of a soft and elastic resin material, and has a thickness of, for example, about 50 µm to 100 µm. Moreover, for the dicing sheet 21, a material through which at least ultraviolet rays are transmitted well is preferable. Since the ultraviolet rays are transmitted through the dicing sheet 21, the semiconductor device parts 24 can be easily separated from the dicing sheet 21 by performing ultraviolet irradiation from below the dicing sheet 21 in a subsequent step to reduce adhesive force of an adhesion layer 25.

The adhesion layer 25 is formed so as to cover the entire upper surface of the dicing sheet 21, and has a function of attaching the radiator plate 19 to the dicing sheet 21. The adhesion layer 25 has a thickness of, for example, about 20 µm to 40 µm. Moreover, as the adhesion layer 25, a material having adhesion reduced when hardened by external force applied thereto is preferable. As the external force, there are, for example, heat and light rays having a predetermined wavelength (for example, the ultraviolet rays). As an example, a resin material having adhesion reduced when hardened by irradiation of ultraviolet rays is suitable as the material of the adhesion layer 25. The dicing sheet 21 having such a type of adhesion layer 25 coated to its surface is generally called a UV sheet.

With reference to FIG. 3B, next, the semiconductor wafer 22 and the radiator plate 19 are diced at the same time to individually separate the semiconductor device parts 24. Here, a peripheral part of the dicing sheet 21 having the semiconductor wafer 22 and the like attached thereto is mechanically supported by a wafer ring 23. Here, the wafer ring 23 is obtained by processing a metal plate made of stainless steel or the like, for example, into a ring shape, and an inside diameter thereof is larger than a diameter of the semiconductor wafer 22.

Since the semiconductor device parts 24 are arranged in the matrix pattern, dicing is performed a number of times along the dicing lines 27 in one direction by use of a blade 26. Thereafter, the wafer ring 23 is rotated 90°, and the dicing is performed again a number of times along the dicing lines 27.

With reference to FIG. 3C, in this step, the dicing is performed so as to cut at least the covering layer 16, the insulating layer 12, the semiconductor wafer 22 and the radiator plate 19. In order to surely perform the cutting, the dicing may actually be performed so as to cut the adhesion layer 25 and to partially cut the dicing sheet 21.

In this embodiment, by providing the radiator plate 19 between the semiconductor wafer 22 and the dicing sheet 21, breakage of the semiconductor wafer 22 is prevented. To be more specific, the dicing sheet 21 is made of a soft resin material. Accordingly, when pressing force of the blade 26 is applied to the semiconductor wafer 22 from above, the dicing sheet 21 below a portion with which the blade 26 comes into contact is sunk. Then, there is a risk that breakage is caused by a bending stress acting on the semiconductor wafer 22. In this embodiment, the radiator plate 19 which is harder than the dicing sheet 21, and which has good mechanical strength is provided on the lower surface of the semiconductor wafer 22. Thus, the bending stress described above is reduced by the radiator plate 19. As a result, the cracking of the semiconductor wafer 22 is prevented.

Furthermore, in this embodiment, the grooves 18 of the radiator plate 19 are positioned below the dicing lines 27 positioned between the semiconductor device parts 24. Thereby, the radiator plate 19 is divided only by removing the thick portions of the radiator plate 19 by dicing, in which portions the grooves 18 are not provided. When the radiator plate 19 made of a metal such as copper is diced by use of the dicing blade 26, the dicing blade 26 is easily worn away. Thus, by performing the dicing in the portions where the grooves 18 are provided, portions of the radiator plate 19 to be cut become thinner. As a result, there is an advantage that wear of the blade 26 can be reduced.

By this step, the individual semiconductor device parts 24 are obtained from the semiconductor wafer 22. The individual semiconductor device parts 24 are also electrically separated from each other. Thus, electrical characteristics and the like of the individual semiconductor device parts 24 can be tested by connecting probes to the external electrodes 15.

Figure 4:
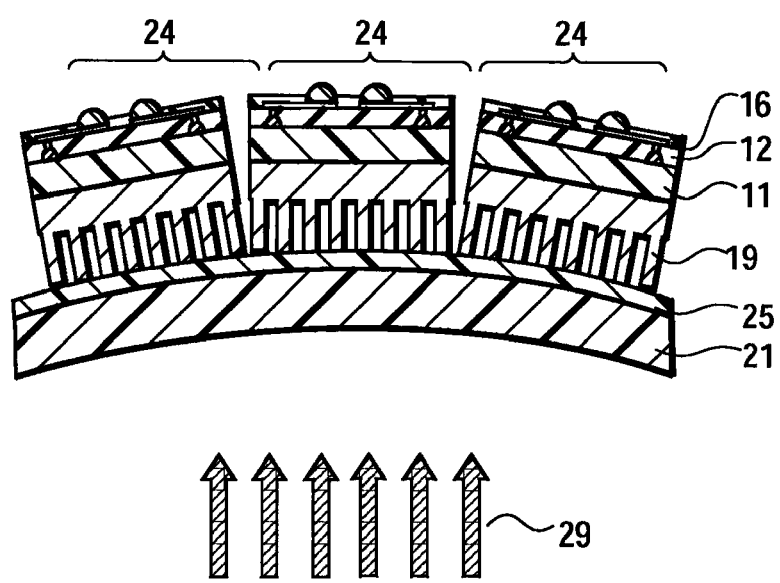
FIG. 4 is a cross-sectional view showing the method for manufacturing a semiconductor device of the preferred embodiments of the present invention.

With reference to FIG. 4, next, the semiconductor device parts 24 are separated from the dicing sheet 21. FIG. 4 is a cross-sectional view showing this step.

With reference to FIG. 4, in this step, ultraviolet rays 29 are irradiated from below the dicing sheet 21. Since the dicing sheet 21 is made of a resin material highly transparent to the ultraviolet rays, the ultraviolet rays 29 are transmitted through the dicing sheet 21 and reach the adhesion layer 25. The adhesion layer 25 irradiated with the ultraviolet rays 29 is hardened, and the adhesive force thereof is reduced. Thus, a situation that facilitates separation of the semiconductor device parts 24 is created.

Next, by use of an unillustrated adsorption collet, the semiconductor device parts 24 are separated from the dicing sheet 21. Since the adhesive force of the adhesion layer 25 is reduced by the ultraviolet irradiation described above, the semiconductor device parts 24 can be easily separated.

In this step, the radiator plate 19 is attached to the lower surface of the semiconductor substrate 11 in each of the semiconductor device parts 24. Thus, cracking and chipping of the semiconductor substrate 11 in the separation step can be prevented. To be more specific, when the unillustrated adsorption collet is used to lift up the semiconductor device part 24 positioned in the center, the dicing sheet 21 is slightly lifted up along therewith. The reason why the dicing sheet 21 is lifted up is because the adhesive force of the adhesion layer 25 is slightly remaining.

When the semiconductor device part 24 in the center is further lifted up in the above-described state, the lifted semiconductor device part 24 in the center may come into contact with the semiconductor device parts 24 on both sides thereof. In the conventional case, the semiconductor substrates 11 are attached directly to the dicing sheet 21. Thus, chipping or cracking of the fragile semiconductor substrates 11 is caused by contact therebetween. In this embodiment, the radiator plate 19 made of the metal is attached to the lower surface of the semiconductor substrate 11. Thereby, even if the semiconductor device parts 24 adjacent to each other come into contact with each other along with picking up thereof, the metal radiator plates 19 come into contact with each other. Accordingly, the semiconductor substrates 11 are not damaged. Moreover, since the radiator plates 19 are made of highly ductile metal, the radiator plates 19 are hardly damaged by the contact therebetween. Even if the radiator plates 19 are damaged, there is hardly any problem in terms of appearance.

By the above steps, a semiconductor device 10 shown in FIGS. 1A and 1B is manufactured. Moreover, each of the semiconductor device parts 24 separated from the dicing sheet 21 is carried to be mounted on a mounting substrate or the like by a reflow step of melting the external electrodes, and the like.

Third Embodiment

Figure 5A:
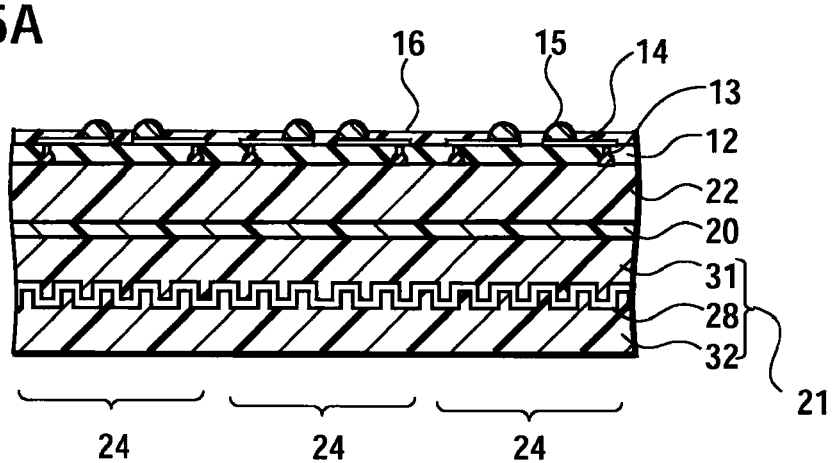
FIGS. 5A to 5C are cross-sectional views showing a method for manufacturing a semiconductor device of the preferred embodiments of the present invention.
Figure 5B:
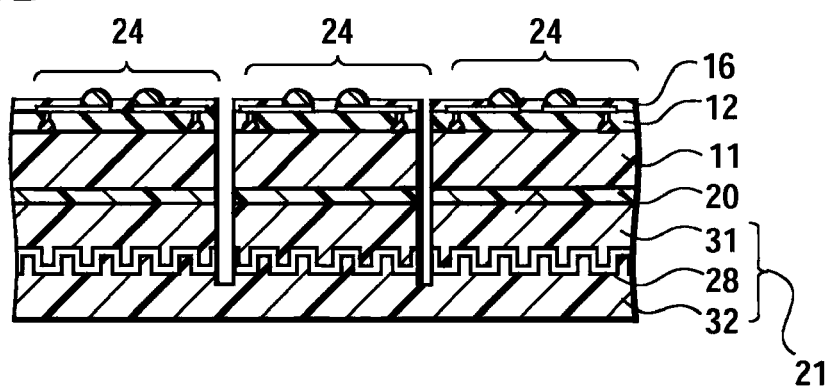
Figure 5C:
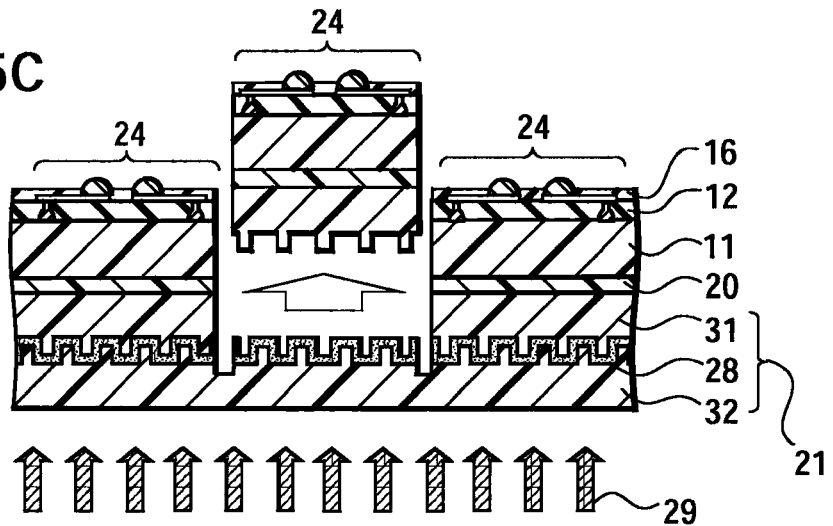
Figure 6A:
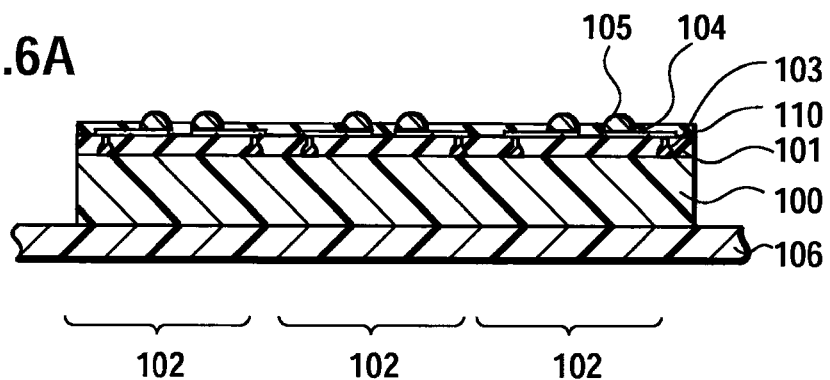
FIGS. 6A to 6C are cross-sectional views showing a conventional method for manufacturing a semiconductor device.
Figure 6B:
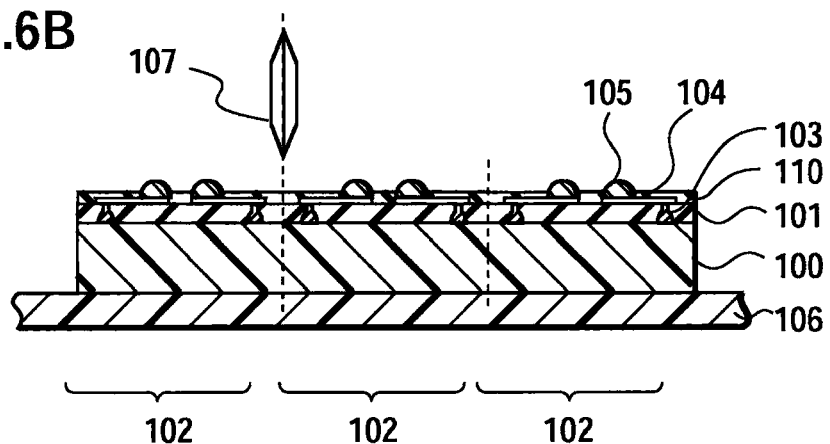
Figure 6C:
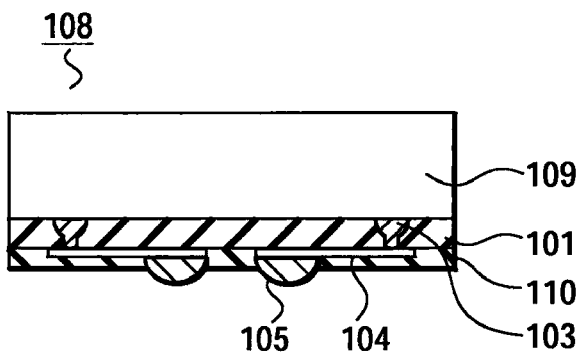

With reference to FIGS. 5A to 5C, description will be given of a method for manufacturing a semiconductor device according to another embodiment. The manufacturing method of this embodiment is different from that of the second embodiment in a point that a part of a dicing sheet is left as a radiator in the semiconductor device. In the other points, this embodiment is the same as the second embodiment described above.

With reference to FIG. 5A, first, a semiconductor wafer 22 having a number of semiconductor device parts 24 formed thereon by a diffusion step and the like is attached to a dicing sheet 21 with a second adhesion layer 20 interposed therebetween.

The dicing sheet 21 includes a first sheet 31 and a second sheet 32, which are bonded to each other with a first adhesion layer 28 interposed therebetween. A boundary surface between the first and second sheets 31 and 32 is set to be an uneven surface. Here, the uneven surface has a cross-section with rectangular concaves and convexes. Accordingly, on the boundary surface between the sheets, the second sheet 32 is formed to be concave in a portion where the first sheet 31 is formed to be convex, and the second sheet 32 is formed to be convex in a portion where the first sheet 31 is formed to be concave. The dicing sheet 21 has a thickness of, for example, about 100 μm to 200 μm.

An adhesion surface between the first and second sheets 31 and 32 has an uneven shape. Accordingly, adhesion between the sheets is improved. Thus, separation between the sheets in the middle of manufacturing can be prevented. Furthermore, since a rear surface of the first sheet 31, which forms a part of the device as a radiator, has the uneven shape, a surface area is increased to improve a heat radiation effect.

The first sheet 31 is an upper layer of the dicing sheet 21, and an upper surface thereof is attached to a rear surface of the semiconductor wafer 22 with the second adhesion layer 20 interposed therebetween. The first sheet 31 is used as the radiator in the semiconductor device. Thus, for improvement in thermal conductivity, the first sheet 31 may be made of resin in which inorganic fillers such as silica are mixed. A thickness of the first sheet 31 may be about half that of the dicing sheet 21, and is, for example, about 50 µm to 100 µm.

The second sheet 32 forms a lower layer of the dicing sheet 21. A preferable material of the second sheet 32 is a resin material through which light rays (for example, ultraviolet rays) irradiated for reducing adhesive force of the first adhesion layer 28 are transmitted well. By using the resin material described above to form the second sheet 32, the light rays irradiated from below the dicing sheet 21 can easily reach the first adhesion layer 28. A thickness of the second sheet 32 may be about 50 µm to 100 µm, which is the same as that of the first sheet 31.

The second adhesion layer 20 has a function of bonding the first sheet 31, which forms a part of the semiconductor device as the radiator, to the semiconductor wafer 22. As the second adhesion layer 20, a normal insulating adhesive resin can be adopted. In order to maintain adhesive force also in the next step of ultraviolet irradiation and subsequent steps, the second adhesion layer 20 is required not to have the adhesive force reduced by the ultraviolet irradiation.

As the first adhesion layer 28, a resin material having adhesive force reduced by heating or light irradiation is preferable. By using the resin material described above to form the first adhesion layer 28, the first sheet 31, which forms a part of the semiconductor device, and the second sheet 32, which functions as supporting member for dicing, are easily separated from each other.

With reference to FIG. 5B, the semiconductor wafer 22 is divided by dicing so as to separate the semiconductor device parts 24 from each other. Details of the dicing in this step are the same as those in the second embodiment described above. Here, the dicing is performed so as to divide at least a covering layer 16, a insulating layer 12, the semiconductor wafer 22, the second adhesion layer 20 and the first sheet 31. Furthermore, in order to surely perform the dicing, the dicing may be performed until the first adhesion layer 28 and part of the second sheet 32 are divided.

With reference to FIG. 5C, next, each of the semiconductor device parts 24 is separated from the dicing sheet 21. First, ultraviolet rays 29 are irradiated from below the dicing sheet 21. Accordingly, the irradiated ultraviolet rays 29 are transmitted through the second sheet 32, and reach the first adhesion layer 28. Thereby, the first adhesion layer 28 is hardened and the adhesive force thereof is reduced. Moreover, in the case where the first adhesion layer 28 has a property that the adhesive force is reduced by heating, the adhesive force of the first adhesion layer 28 is reduced by heat treatment. Meanwhile, the adhesive force of the second adhesion layer 20 is not changed even if the ultraviolet rays 29 reach the second adhesion layer 20.

Next, by use of an unillustrated adsorption collet or the like, the semiconductor device parts 24 are separated (picked up) from the dicing sheet 21. Here, the first sheet 31, which is attached to the lower surface of a semiconductor substrate 11 with the second adhesion layer 20 interposed therebetween, is also separated from the dicing sheet 21 as a part of the semiconductor device pad 24.

Moreover, even if the semiconductor device parts 24 adjacent to each other came into contact with each other in the pick up step described above, the first sheets 31 made of the resin material at the bottoms come into contact with each other. Thus, the semiconductor substrates 11 do not come into contact with each other. As a result, cracking and damage of the semiconductor substrates 11 in this step are suppressed.

By the above steps, the semiconductor device having the radiator made of the resin material is manufactured.

Note that, when thermal expansion coefficients of the semiconductor substrate 11 and the first sheet 31 are significantly different from each other, warpage is likely to occur in the semiconductor substrate 11. For this reason, materials, thicknesses and the like of the insulating layer 12, the covering layer 16 and wirings 14 are determined so as to set upper and lower surfaces of the semiconductor substrate 11 to have the same thermal expansion coefficient and to have the same thermal expansion coefficient as that of the first sheet 31. For example, the insulating layer 12 and the covering layer 16 are formed by use of the same material as that of the first sheet 31.

According to the semiconductor device of the preferred embodiments of the present invention, since the radiator is mounted cm the principal surface of the semiconductor substrate, a surface area of the entire device is increased. Thus, heat radiation properties can be improved. Furthermore, when a material having a thermal conductivity higher than that of the semiconductor substrate is adopted as the radiator, heat generated by operations of the circuit elements formed in the semiconductor substrate is actively discharged to the outside through the radiator. Therefore, even if high-speed processing circuits are built into the semiconductor device, an increase in a temperature of the semiconductor device can be suppressed.

According to the method for manufacturing a semiconductor device of the preferred embodiments of the present invention, after the semiconductor wafer is attached to the dicing sheet with the radiator plate interposed therebetween, the semiconductor device parts formed on the semiconductor wafer are individually separated. Therefore, the radiator plate relaxes a bending stress acting on the semiconductor wafer in the dicing step. As a result, cracking of the semiconductor wafer is suppressed.

Furthermore, in the preferred embodiments of the present invention, the semiconductor device parts are separated from the dicing sheet in a state where the radiator plates made of a metal or the like are attached to the semiconductor device parts. Therefore, even if the separated semiconductor device parts come into contact with the other adjacent semiconductor device parts, the radiator plates in the bottoms come into contact with each other. As a result, the semiconductor substrates in the semiconductor device parts do not come into contact with each other, and occurrence of chipping is prevented.

Still Furthermore, according to the method for manufacturing a semiconductor device of the preferred embodiments of the present invention, the semiconductor device is manufactured by use of the dicing sheet including the first and second sheets bonded by the uneven adhesion surface. Therefore, the first sheet can be left on the semiconductor device side by separating the first and second sheets after the semiconductor water is divided into the individual semiconductor device parts by use of the dicing sheet. As a result, the first sheet that is a part of the dicing sheet can be easily mounted, as the radiator, on the semiconductor device.

What is claimed is:

1. A method for manufacturing a semiconductor device, comprising the steps of:
   preparing a semiconductor wafer which includes a first principal surface, on which electrodes electrically connected to circuit elements are formed, and a second principal surface facing the first principal surface, and which has a plurality of semiconductor device parts formed thereon, which are defined by dicing lines;
   attaching the semiconductor wafer to a dicing sheet with a radiator plate disposed on the second surface of the semiconductor wafer and interposed between the dicing sheet and the semiconductor wafer, wherein the radiator plate is attached to the plurality of semiconductor device parts; and
   subsequently separating the semiconductor device parts from each other by dicing through the semiconductor wafer and the radiator plate so that after the separating each semiconductor device part of the plurality of semiconductor device parts has a portion of the radiator plate attached thereto wherein the portion that is attached has a size that is substantially the same as a size of the semiconductor device part.

2. The method for manufacturing a semiconductor device, according to claim 1, further comprising the step of:
   separating the semiconductor device parts in a state of having the radiator plate attached thereto from the dicing sheet.

3. The method for manufacturing a semiconductor device, according to claim 1, wherein the radiator plate includes a first surface attached to the semiconductor wafer and a second surface facing the first surface, and grooves extended parallel with the dicing lines on the semiconductor wafer are provided in the second surface of the radiator plate.

4. The method for manufacturing a semiconductor device, according to claim 3, wherein positions of the grooves and positions of the dicing lines are superposed.

5. The method for manufacturing a semiconductor device, according to claim 3, wherein wirings which electrically connect the circuit elements to the electrodes are formed on the first principal surface of a semiconductor substrate, and the grooves are formed according to a difference in volume between the wiring and the radiator plate.

6. A method of forming a semiconductor device comprising:
   preparing a semiconductor wafer including a first principal surface, on which electrodes electrically coupled to circuit elements are formed, and a second principal surface facing the first principal surface, the semiconductor wafer having locations for a plurality of semiconductor devices;
   forming wirings on the first principal surface of the semiconductor wafer and electrically coupled to the electrodes;
   forming a radiator on the second principal surface, wherein the radiator has a planar size that is substantially the same as that of the semiconductor wafer and overlies the plurality of semiconductor devices; and wherein a thickness of the radiator is no less than a thickness of the wiring; and
   dicing through the radiator and the wafer to singulate the plurality of semiconductor devices wherein portions of the radiator remain attached to the plurality of semiconductor devices and have a size that is substantially the same as the semiconductor device part attached thereto.

7. A semiconductor device comprising:
   providing a semiconductor wafer including a first principal surface, on which electrodes electrically coupled to circuit elements are formed, and a second principal surface facing the first principal surface;
   forming wirings on the first principal surface and electrically coupled to the electrodes;
   forming a radiator mounted on the second principal surface of the semiconductor wafer, wherein the radiator is mounted onto the second principle surface prior to separating a semiconductor substrate from the semiconductor wafer including forming the radiator to have a thickness that is no less than a thickness of the wiring; and
   separating the semiconductor substrate from the semiconductor wafer wherein a portion of the radiator remains on the semiconductor substrate.

8. The semiconductor device of claim 7 wherein the radiator includes a planar size that is substantially the same as that of the semiconductor wafer.

9. The semiconductor device of claim 7 wherein the thickness of the radiator is substantially the same as the thickness of the wiring.

* * * * *